United States Patent Office
3,495,979
Patented Feb. 17, 1970

3,495,979

COPYING MATERIAL FOR USE IN THE PHOTOCHEMICAL PREPARATION OF PRINTING PLATES

Urbain Leopold Laridon and Gerard Albert Delzenne, Wilrijk-Antwerp, Johan Lodewijk Verelst, Kontich, and Hugo Vital Van Goethem, Berchem-Antwerp, Belgium, assignors to Gevaert-Agfa N.V., Mortsel, Belgium, a company of Belgium No Drawing. Filed Feb. 8, 1967, Ser. No. 614,544
Claims priority, application Great Britain, Feb. 28, 1966, 8,727/66
Int. Cl. C07c *113/00;* G03f *7/08;* G03c *1/52*
U.S. Cl. 96—33 10 Claims

ABSTRACT OF THE DISCLOSURE

Photochemical process of making a printing plate wherein the following napthoquinone diazide is used in a light-sensitive coating:

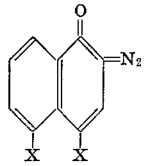

wherein one X is fluorosulfonyl, the other being hydrogen.

This invention relates to light-sensitive compounds, and to the production of light-sensitive coatings for use in the manufacture of copying materials, more particullarly of copying materials yielding positive images.

It is well known to produce so-called tanned images in a layer consisting of a colloid that is hardened by products produced by the action of light upon certain light-sensitive substances, which are homogeneously dispersed in that colloid. Among these light-sensitive substances are known salts of chromic acid, some diazo compounds, and the like. The colloids hardened by the action of light are capable of selectively retaining greasy ink, or can be used for the photochemical production of printing plates. The printing plates obtained by these methods, however, are negative with respect to the master pattern, and further treatments are necessary to transform these negative printing images into images that are positive with respect to the master pattern.

We have found that a light-sensitive system based on the phototransformation of new compounds containing a quinone diazide group can be used for recording and reproducing optical information, yielding directly positive images or printing plates.

According to the invention a copying material for use in the photochemical preparation of printing plates is provided, which comprises a support having thereon a light-sensitive coating comprising a napthoquinone diazide of the formula:

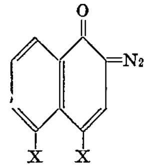

wherein one X represents a fluorosulphonyl group, the other X representing a hydrogen atom.

In the above formula, the group "$=N_2$" is intended to cover the alternative forms of the diazide group, namely $$=\overset{+}{N}=\overset{-}{N} \text{ and } -N\equiv\overset{-}{N}$$

Suitable napthoquinone diazides are napthoquinone-1,2 - diazide(2)-4-sulphofluoride and napthoquinone-1,2-diazide(2)-5-sulphofluoride.

In general a polymer is added to the light-sensitive layer, especially when it is intended to etch the images obtained on metallic supports, or when the images obtained are directly to be used as printing plates. For such uses the said polymer is preferably an alkali-soluble polymer. As alkali-soluble polymers may be used copolymers of unsaturated carboxylic acid such as acrylic acid, methacrylic acid, crotonic acid, maleic acid, fumaric acid, itaconic acid and citraconic acid. If the coplyomer comprises an unsaturated dicarboxylic acid, the half-esters and half-amides thereof may be used too. These unsaturated carboxylic acids are copolymerized with ethylenically unsaturated compounds, which are substantially insoluble in an alkaline medium and which are present in the copolymer in such a proportion that the copolymer itself remains soluble in an alkaline medium. Ethylenically unsaturated compounds which may be so used to include styrene and its derivatives, vinyl chloride, vinylidene chloride, vinyl esters such as vinyl acetate, acrylic acid esters, methacrylic acid esters, acrylonitrile, methacrylonitrile, etc.

Preferred alkali-soluble polymers, however, are the so-called novolaks. According to British Standard 1755–1951 these are "soluble, fusible, synthetic resins produced from a phenol and an aldehyde, having no reactive groups (i.e. methylol groups) in the molecule and therefore incapable of condensing with other novolak molecules on heating without the addition of hardening agents."

The amount of alkali-soluble resin added to the light-sensitive coating may vary within wide limits, but in general at least one part by weight of alkali-soluble resin is present for every four parts by weight of napthoquinone diazide.

The light-sensitive coating consists of napthoquinone-1,2-diazide(2)-4- or -5-sulphofluoride and occasionally of an alkali-soluble polymeric material. This coating may also comprise minor amounts of additives, which increase the light-sensitivity of the napthoquinone diazide group.

Further, the light-sensitive coating may also comprise stabilizers, plasticizers, extenders, dyes and the like. The term "light-sensitive composition" in the accompanying description is to be understood to mean a composition comprising the napthoquinone-1,2 - diazide(2)-4- or -5-sulphofluoride, and which may include the alkali-soluble polymers and other additives.

In order to prepare a copying material in accordance with the invention a support is coated with a solution in an organic solvent or in a mixture of organic solvents of the napthoquinone-1,2-diazide(2)-4- or -5-sulphofluoride, and which solvent(s) may include the alkali-soluble polymer. Metal supports or supports coated with metals such as for example zinc, and especially aluminum, are excellently suited as base materials for a printing plate. It is not strictly necessary to subject the metal supports to be used to any preliminary chemical treatment in order to render their surfaces suitable for accepting the light-sensitive layer. A simple mechanical roughening of the metallic surface proves to be quite sufficient for the application of the light-sensitive layer, which firmly attaches itself to the metallic base in the form of a thin uniform film. For the production of planographic printing plates there can also be used, e.g., plates of stone or glass and also especially treated sheets of paper or plastic foils.

The base or support is coated by whirlcoating, brushing or spraying with a solution of the light-sensitive composition in a suitable solvent or may be coated continuously on known coating machines, whereupon the solvent or solvent mixture is eliminated by known means such as evaporation, thus having a more or less thin coating of the light-sensitive composition upon the base or support. The thickness of the light-sensitive layer obtained may be from about 0.5 to 20$\mu$ and is preferably between 1 and 5$\mu$. The light-sensitive coating is then ready for exposure to actinic light rays. The light source should preferably furnish an effective amount of ultraviolet radiation. Suitable sources of light include carbon arcs, xenon lamps, mercury vapour lamps, fluorescent lamps, argon glow lamps, photographic flood lamps and tungsten lamps.

The light-sensitive layer is exposed to actinic light through a contacted transparent master pattern consisting solely of opaque and transparent areas, e.g., the so-called line or half-tone positive or negative wherein the opaque areas are of the same optical density. However, it is also possible to expose the light-sensitive layer to a projected image.

During exposure, it is considered that the light probably induces the photolytic transformation of the quinone diazide groups into alkali-soluble indene-carboxylic acid derivatives.

The development or removal of the coating on the exposed areas can be effected by means of water or an aqueous composition, preferably, however, by means of an alkaline aqueous solution rapidly dissolving the image-wise indene-carboxylic acids which are probably formed. An alkaline developer which may conveniently be used is an aqueous solution of a phosphate of an alkaline metal such as sodium phosphate. In the non-exposed portions of the printing plate the presence of the unconverted naphthoquinone diazides renders the light-sensitive layer insoluble in alkaline medium, even if an alkali-soluble polymer such as novolak is present. Accordingly, the unexposed parts of the layer remain to form a positive image of the master pattern. Those positive images can be used as printing plates, such as for planographic and offset printing. They may also be subjected to an etching process which make them suitable for intaglio or relief printing.

After removal of the exposed areas of the light-sensitive layer by the developing solution, the ink-repellency of the unshielded areas of the base material can be improved by an after-treatment with a lithographic preparation for hydrophilizing or enhancing the hydrophility of said areas. Compounds and compositions suited for that purpose are described, e.g., in United Kingdom patent specification 946,538.

The ink-receptivity of the hydrophobic non-exposed areas can be improved by treating the developing printing plate with a lacquer, which adheres to the hydrophobic areas and form an oleophilic deposit thereon. Suitable lacquers and the method of applying them are described in United Kingdom patent specification 968,706 Belgian patent specification 631,790.

In order to prepare a printing form for gravure printing an exposure and etching techniques is used whereby in the base material according to a screen pattern cells can be formed for receiving the printing ink.

Base materials suited for etching are well known. More particularly are mentioned base materials, which substantially consist of zinc, copper, steel or an etchable magnesium alloy.

In order to prepare a planographic printing plate a base material is chosen suited for lithographic printing, preferably a zinc sheet.

A special advantage of the use of the naphthoquinone diazides according to the invention is the easy way in which these products can be synthetized, starting from inexpensive raw materials. A further advantage of the present light-sensitive compositions is the great stability of the naphthoquinone diazides of the invention so that photographic materials containing them can be prepared a considerable time before use.

Example 1

In a three-necked flask equipped with a reflux condenser, a calcium chloride tube, a thermometer, and a stirrer are placed 3 litres of freshly distilled chlorosulphonic acid.

Thereupon 500 g. of sodium salt of naphthoquinone-1,2-diazide(2)-5-sulphonic acid are added portionwise under stirring and in such a way that the temperature does not surpass 60° C. Then stirring is continued for 6 hr. at 55–60° C. in the dark, and the reaction mixture is left to stand overnight at room temperature. Next, the reaction mixture is dropwise added with stirring to 20 litres of ice-water in such a way that the temperature does not surpass 40–50° C. The precipitate formed is filtered by suction, washed first with water and then with 100 ccs. of acetone.

The obtained naphthoquinone - 1,2 - diazide(2)-5-sulphochloride in its turn together with 1.5 litre of acetone is placed in a three-necked flask provided with a stirrer, a dropping funnel, and a reflux condenser. Whilst stirring and refluxing, a solution of 105 g. potassium fluoride in 250 ccs. of water is dropwise added thereto within 15 min., whereupon the reaction mixture is stirred and refluxed in the dark for further 6 hr. Next, with stirring and without cooling, 2.5 litres of water are added. The reaction mixture is then stirred for still another 15 min. and allowed to cool.

The precipitate formed is filtered with suction, thoroughly washed with water, and dried at 50° C. under reduced pressure. The obtained naphthoquinone - 1,2-diazide(2)-5-sulphofluoride has a melting point of about 140° C.

An amount of 50 mg. of this product together with 50 mg. of novolak are dissolved in a mixture of 3 ccs. of glycol ethyl ether and 2 ccs. of acetone. From this solution a coating is applied to an aluminum foil, in such a way, that after removal of the solvents its thickness amounts to approximately 2$\mu$. This layer is exposed through a line transparency with an 80 watt mercury vapour lamp at a distance of 15 cm. As developing liquid is used a mixture of 5 g. of sodium phosphate-12-water and 15 g. of sodium chloride in 100 ccs. of water. Thereby, the exposed areas of the layer are washed away so that a positive relief image of the original line transparency remains. The unshielded aluminium is rendered more hydrophilic on the exposed areas by means of a 1% phosphoric acid solution, whereafter the printing plate is inked.

In order to obtain a good positive printing plate an exposure time of 1 minute with an 80 watt mercury vapour lamp suffices. If, however, an ordinary 300 watt lamp is used, an exposure time of 2 minutes is required.

In the above-described light-sensitive layer, the novolak can be replaced by another alkali-soluble polymer e.g. a copolymer of maleic anhydride and styrene or ethylene.

Example 2

The process of Example 1 is repeated with the exception that as starting material the sodium salt of naphthoquinone-1,2-diazide(2)-4-sulphonic acid is used. At the end of the process naphthoquinone-1,2-diazide(2)-4-sulphofluoride is obtained which is dissolved together with the novolak in a 1:1 mixture of acetone and methylcellosolve. Just as in Example 1 this solution is applied to an aluminium foil exposed through a line transparency and developed with the mixture of sodium phosphate and sodium chloride in water whereby the exposed areas of the layer are washed away. A positive relief image of the original line transparency is obtained. For obtaining a good relief image using an 80 watt mercury vapour lamp at a distance of 15 cm. an exposure time of 1½ minute suffices.

We claim:

1. A process for the photochemical preparation of a positive printing plate, which comprises exposing to actinic light under a master pattern a copying material which comprises a support having thereon a light-sensitive coating containing a naphthoquinone diazide of the formula:

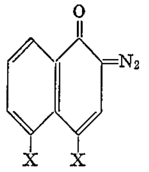

wherein one X is fluorosulfonyl, the other X being hydrogen, and developing the resulting positive image of the master pattern by dissolving the exposed portions of the coating in an aqueous alkaline liquid.

2. A process as outlined in claim 1, wherein the developer is an aqueous solution of sodium phosphate and of sodium chloride.

3. A process as outlined in claim 1, including the step of etching the developed plate in order to produce a positive relief printing plate.

4. Copying material for use in the photochemical preparation of printing plates, which comprises a support having thereon a light-sensitive coating comprising a naphthoquinone diazide of the formula:

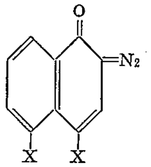

wherein one X is fluorosulfonyl, the other X being hydrogen.

5. Copying material according to claim 4, wherein the light-sensitive coating comprises also an alkali-soluble polymer.

6. Copying material according to claim 5, wherein at least one part by weight of alkali-soluble polymer is present for every four parts by weight of naphthoquinone diazide.

7. Copying material according to claim 6, wherein the alkali-soluble polymer is a novolak resin.

8. Copying material according to claim 4, wherein the (2)-4-sulphofluoride.

9. Copying material according to claim 4, wherein the naphthoquinone diazide is naphthoquinone-1,2-diazide-(2)-5-sulphofluoride.

10. A naphthoquinone diazide of the formula:

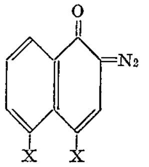

wherein one X is fluorosulfonyl, the other X being hydrogen.

References Cited

UNITED STATES PATENTS

| | | | |
|---|---|---|---|
| 807,422 | 12/1905 | Elbel | 260—142 |
| 1,444,469 | 2/1923 | Kogel | 96—91 |
| 1,847,513 | 3/1932 | Hentrich et al. | 260—141 |
| 1,853,462 | 4/1932 | Schmidt et al. | 96—91 |
| 2,067,690 | 1/1937 | Alink et al. | 96—91 XR |
| 2,436,697 | 2/1948 | Lecher et al. | 260—142 XR |
| 3,269,837 | 8/1966 | Sus | 96—91 |

FOREIGN PATENTS

| | | |
|---|---|---|
| 95,406 | 9/1960 | Netherlands. |

NORMAN G. TORCHIN, Primary Examiner

C. BOWERS, Assistant Examiner

U.S. Cl. X.R.

96—75, 91; 260—141

PO-1050
(5/69)

UNITED STATES PATENT OFFICE
CERTIFICATE OF CORRECTION

Patent No. 3,495,979 Dated February 17, 1970

Inventor(s) Urbain Leopold Laridon et al

It is certified that error appears in the above-identified patent and that said Letters Patent are hereby corrected as shown below:

Column 1, line 18, delete "napthoquinone", and insert -- naphthoquinone --; column 1, line 57, delete "napthoquinone", and insert -- naphthoquinone --; column 2, line 1, delete "napthoquinone", and insert -- naphthoquinone --; column 2, line 2, delete "napthoquinone", and insert -- naphthoquinone --; column 2, line 35, delete "napthoquinone", and insert -- naphthoquinone --; column 2, line 37, delete "napthoquinone", and insert -- naphthoquinone --; column 2, line 41, delete "napthoquinone", and insert -- naphthoquinone --; column 2, line 46, delete "napthoquinone", and insert -- naphthoquinone --; column 3, line 36, delete, "Those" and insert -- These --; column 3, line 54, after "968,706" insert -- and --; column 6, line 5, after "the" insert -- naphthoquinone diazide is naphthoquinone-1, 2-diazide --.

SIGNED AND
SEALED
OCT 13 1970

(SEAL)
Attest:

Edward M. Fletcher, Jr.
Attesting Officer

WILLIAM E. SCHUYLER, JR.
Commissioner of Patents